(12) United States Patent
Nurminen

(10) Patent No.: US 7,109,573 B2
(45) Date of Patent: Sep. 19, 2006

(54) THERMALLY ENHANCED COMPONENT SUBSTRATE

(75) Inventor: Janne T Nurminen, Oulunsalo (FI)

(73) Assignee: Nokia Corporation, Espoo (FI)

( * ) Notice: Subject to any disclaimer, the term of this patent is extended or adjusted under 35 U.S.C. 154(b) by 15 days.

(21) Appl. No.: 10/459,140

(22) Filed: Jun. 10, 2003

(65) Prior Publication Data

US 2004/0253767 A1 Dec. 16, 2004

(51) Int. Cl.
| | |
|---|---|
| H01L 23/495 | (2006.01) |
| H01L 23/48 | (2006.01) |
| H01L 23/52 | (2006.01) |
| H01L 23/04 | (2006.01) |
| H01L 23/10 | (2006.01) |

(52) U.S. Cl. .................. 257/675; 257/692; 257/698; 257/706; 257/712; 257/676; 257/695; 257/707

(58) Field of Classification Search ............. 257/692, 257/698, 706, 712, 675, 676, 695, 707; 438/122, 438/125, 599

See application file for complete search history.

(56) References Cited

U.S. PATENT DOCUMENTS

| | | | |
|---|---|---|---|
| 5,027,191 A | 6/1991 | Bourdelaise et al. ......... 357/74 |
| 5,097,593 A * | 3/1992 | Jones et al. ................ 29/852 |
| 5,399,903 A * | 3/1995 | Rostoker et al. ............ 257/666 |
| 6,088,233 A * | 7/2000 | Iijima et al. ................ 361/760 |
| 6,201,298 B1* | 3/2001 | Sato et al. ................... 257/691 |
| 6,469,370 B1* | 10/2002 | Kawahara et al. .......... 257/678 |
| 6,483,187 B1 | 11/2002 | Chao et al. ................. 257/712 |
| 6,525,942 B1* | 2/2003 | Huang et al. ............... 361/704 |
| 2002/0001178 A1* | 1/2002 | Iijima et al. ................ 361/704 |

FOREIGN PATENT DOCUMENTS

EP        405330 A2 *   1/1991

* cited by examiner

Primary Examiner—David E. Graybill
(74) Attorney, Agent, or Firm—Harrington & Smith,LLP

(57) ABSTRACT

An IC package dissipates thermal energy using thermally and electrically conductive projections. The IC package includes a substrate material with a die pad area, which is suitable to support an integrated circuit. A plurality of solder ball pads is disposed on a first surface of the substrate material and a plurality of conductive projections radiate outwardly from the die pad area and extend to cover a corresponding selected solder ball pad to facilitate the dissemination of thermal energy from the die pad area to the substrate and/or printed wiring board.

20 Claims, 13 Drawing Sheets

— Prior Art —

—Prior Art—

THERMALLY ENHANCED COMPONENT SUBSTRATE

TECHNICAL FIELD

This invention relates generally to dissipating thermal energy (heat) from a die pad. More particularly, this invention relates to a thermally enhanced substrate that reduces thermal resistance of a circuit package and integrates thermal dissipation and electrical conductivity to a particular pin.

BACKGROUND

In attempting to use the area on printed wiring boards (PWB) and printed circuit boards (PCB) more efficiently, semiconductor chip manufactures have been switching from larger, more cumbersome interconnection techniques, such as pin grid arrays ("PGAs") and perimeter leaded quad flat packs ("QFPs"), to smaller assemblies, such as ball grid arrays ("BGAs"). Using BGA technology, semiconductor chips are typically interconnected to their supporting substrates using solder connections. However, the columns of solder are generally designed to be relatively short to maintain the solder's structural integrity, which reduces elastic properties, resulting in,increased susceptibility to solder cracking due to a differential between the coefficient of thermal expansion ("CTE") of the chip relative to the CTE of the supporting substrate. Thus, as the chip heats up during use, both the chip and the substrate expand; and when the heat is removed, both the chip and the substrate contract. The difference between the chip CTE and the substrate CTE can result catastrophic deformation.

Therefore, the ability to dissipate heat that is generated from the operation of integrated circuits (IC) is a major design concern for the electronic industry. This is emphasized because the density of circuits on IC devices has increased substantially in recent years and the reliability and performance of these high density circuits are affected by the thermal environment. Additionally, size considerations require that an increased number of electronic packages be installed into very small spaces, which also greatly increases the need to efficiently dissipate heat from IC packages. As the features of semiconductor chips continue to be reduced in size, the number of chips packed into a given area will be greater and the heat dissipated by the each of these chips will have a greater effect on the thermal mismatch problem discussed above.

Furthermore, IC devices are increasingly being used for high power applications. While many early IC chips operated below a few watts, ICs are being designed to operate around 10 watts, which substantially increases heat generation and the need to effectively dissipate the heat.

In some conventional semiconductor packages, heat generated from a semiconductor chip or integrated circuit (IC), which is typically mounted on a die pad of a substrate, is emitted through two routes. The first route is through external connection terminals of the package and the second route is through the surface of the package. In order to more effectively dissipate the heat, a heat sink can be attached to the package. In a ball grid array (BGA) package, which includes an encapsulating resin formed by molding a semiconductor chip with a plastic resin, the heat sink may be attached directly to the encapsulating resin of the package. Thus, the heat generated from the chip is conducted to the heat sink via the encapsulant and dissipated to the outside by convection.

Other approaches to solve the problem of heat dissipation include adding additional thermal balls under the die area. However, this approach requires modification of the package design and possibly a layout change as well as possible modification of the PWB or PCB design. Another approach is to modify the package type and/or reduce the required power. These approaches are not satisfactory since they require major design changes.

Bourdelaise et al. disclose in U.S. Pat. No. 5,027,191, a chip carrier assembly utilizing a cavity down chip with a pad grid array. The IC chip within the chip carrier is mounted against a surface opposite the PWB to which the chip is attached such that heat transfer from the IC chip may occur along a short path to a heat sink to enable a larger heat transfer rate. The improvement of heat transfer rate is still quite limited due to a small gap that is usually required on the top surface of an IC chip to allow bonding wires to extend from the chip to connection pads surrounding the chip. This small gap between the IC chip and the flat thermal pad serving as a heat sink substantially reduces the heat transfer rate.

Huang et al. disclose in U.S. Pat. No. 6,525,942, a heat dissipation ball grid array (BGA) package. The heat dissipation BGA package includes a plurality of first thermal ball pads formed on the underside of a substrate in the area covered by a chip. The BGA package also includes a plurality of second thermal ball pads or a heat dissipation ring outside the first thermal ball pads. A plurality of signal ball pads is formed outside the second thermal ball pads or the heat dissipation ring. The second thermal ball pads or heat dissipation ring is connected to the first thermal ball pads by conductive trace lines. A plurality of first thermal balls is attached to the respective first thermal ball pads and the signal balls are attached to the respective signal ball pads. The first thermal balls and the signal balls are in contact with corresponding contact points on a printed circuit board. A plurality of second thermal balls is attached to the respective second thermal ball pads or the surface of the heat dissipation ring. The heat dissipation disclosed in Huang is limited because the die pad conducts thermal energy to the first and second thermal balls only through the vias.

Chao et al. disclose in U.S. Pat. No. 6,483,187, a heat spread substrate that includes a metal heat spreader, which has a surface with a cavity that is adapted to support a die. The surface also includes a ground ring arranged at the periphery of the cavity, a substrate-supporting surface surrounding the periphery of the ground ring, a plurality of ground pads arranged at the periphery of the substrate-supporting surface and a plurality of ground pads arranged on the substrate-supporting surface and protruding from it. The substrate also has a plurality of through holes, a plurality of mounting pads and a plurality of ball pads. Chao discloses that a thickness decreasing process is carried out on one of the surfaces of the metal heat spreader to decrease the thickness of part of the areas on the surface. The thickness decreasing process can be accomplished by stamping processes, or by multi-photolithography and half-etching. One drawback to varying the thickness of the heat spreader to dissipate heat is that it requires specific fabrication steps to produce the desired heat spreader shape.

With the above limitations and difficulties, there is still a need in the art of IC packaging techniques to resolve these difficulties and limitations. Specifically, there is a need in the art to provide improved heat dissipation for high power ICs and meanwhile increase the packaging integrity.

SUMMARY OF THE PREFERRED EMBODIMENTS

The foregoing and other problems are overcome, and other advantages are realized, in accordance with the presently preferred embodiments of these teachings.

Accordingly, one embodiment of the present invention is directed to an integrated circuit package and a method of fabrication therefor. The package includes a substrate material and a die pad area, which has dimensions suitable to mount an integrated circuit. A plurality of thermally and electrically conductive ball pads is disposed on the first surface of the substrate material outside the die pad area and a plurality of vias is disposed on an associated ball pad. The vias provide thermal and electrical conductivity from the first surface of the substrate material to the second surface of the substrate material. A plurality of electrically and thermally conductive projections radiate outwardly from the die pad area, such that each projection covers an associated ball pad and each of the projections conduct thermal energy from the first surface of the substrate material to the second surface of the substrate material, through one or more of the vias, and also conduct electrical signals to the associated ball pad.

Another embodiment of the present invention is directed to the integrated circuit package and method as described above, and further including a plurality of thermal balls disposed on the second or bottom surface of the substrate material and outside the die pad area. One or more of the thermal balls are in thermal contact with an associated via, and the thermal balls conduct electrical signals.

Yet another embodiment of the present invention is directed to the integrated circuit package and method as described above that also includes a printed wiring board on which the substrate is mounted. Thermal energy is dissipated from the die pad area to the printed wiring board through the thermal balls.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

The present invention addresses the need for the integrated circuit packages and MCM components to minimize thermal resistance from the die to the printed circuit board (PCB) by integrating thermal and electrical function to the same pin and extending the thermally effective area of the package. The present invention is particularly useful in applications where an enhance thermal path from the die to the solder ball is required, specifically in applications in which there is no overlap between die and solder balls, for example, peripheral pins that have no central solder balls in BGA packages (e.g., Tessera uBGA, ST LF- and TFBGA etc.).

The present invention integrates thermal and electrical functions to the same pin. Specifically I/O pins, which do not overlap with the die, can be thermally connected to the die by using thermally conductive elements, such as copper, between pins and under the die. The pin can be under the die or it can be a peripheral pin. A central thermal ball can have electrical functionality as well. Thus, a feature of the present invention is that signal paths may be used for heat dissipation i.e., thermal conductivity.

The small area of the die can be extended by using a plurality of conductive elements, or projections, that extend from the die area and thus the thermally conductive area becomes wider and reduces overall thermal resistance of the package. The shape and dimensions of the conductive elements is a design choice. Specific dimensions of the conductive elements, or projections, are a function of the particular application and are subject to factors such as circuit parameters, component materials and environments.

Some advantages of the present invention include: better thermal performance of the package; cheaper and smaller package dimensions, since there is no need for additional thermal balls; easier routing and wider line/space in the PWB, which reduces the cost of the PWB; no addition to the cost of manufacturing work or materials; reduces the die shrink thermal effects; decreased thermal resistance of the package; increased package power; increased package reliability; no need for package changes when the die shrinks; no need for re-design of the PWB; less thermal sensitivity; robust assembly; and lower overall cost.

In the present invention, the thermal conductivity element is integrated in the component when copper surfaces of the substrate are generated. The thermal path is created by extending signal pads/routings under the die area to the solder ball pads. The thermal vias conduct heat directly to the solder balls and to the PWB. The present invention may be used with single layer and/or multilayer substrates.

An epoxy/solder resist coating may be used to isolate electrical contacts between the die and signals.

Figure 1:
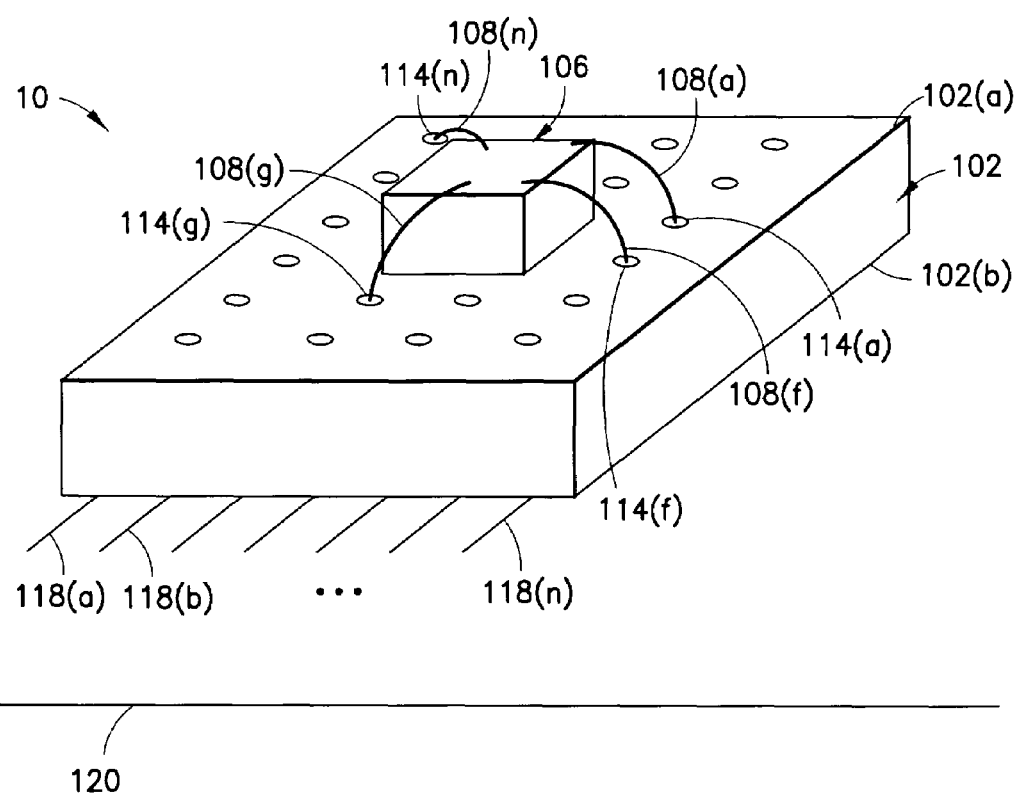
FIG. 1 shows an IC package mounted on a printed circuit board.

FIG. 1 shows an IC package 10, which includes substrate 102 and IC chip 106. The IC package 10 is mounted on PCB or PWB 120, typically via interconnectors 118(a) . . . (n), where n is any suitable number that comports with the design of the IC package 10.

The IC chip 106 is mounted on substrate 102 typically by epoxy or resin suitable to adhere IC chip 106 to a die pad area of substrate 102. Preferably, the material used to adhere chip 106 to substrate 102 has acceptable thermal conductive properties. Wires 108(a) . . . (n), where n is any suitable number, electrically connect portions of IC chip 106 to selected ones of solder ball pads 114(a) . . . (n), where n is any suitable number. A solder ball may be mounted on a corresponding solder ball pad to electrically connect the wire 108 to another location. The substrate 102 has a first surface 102(a) (a chip-facing surface) and a second surface 102(b) (a PWB-facing surface).

Figure 2:
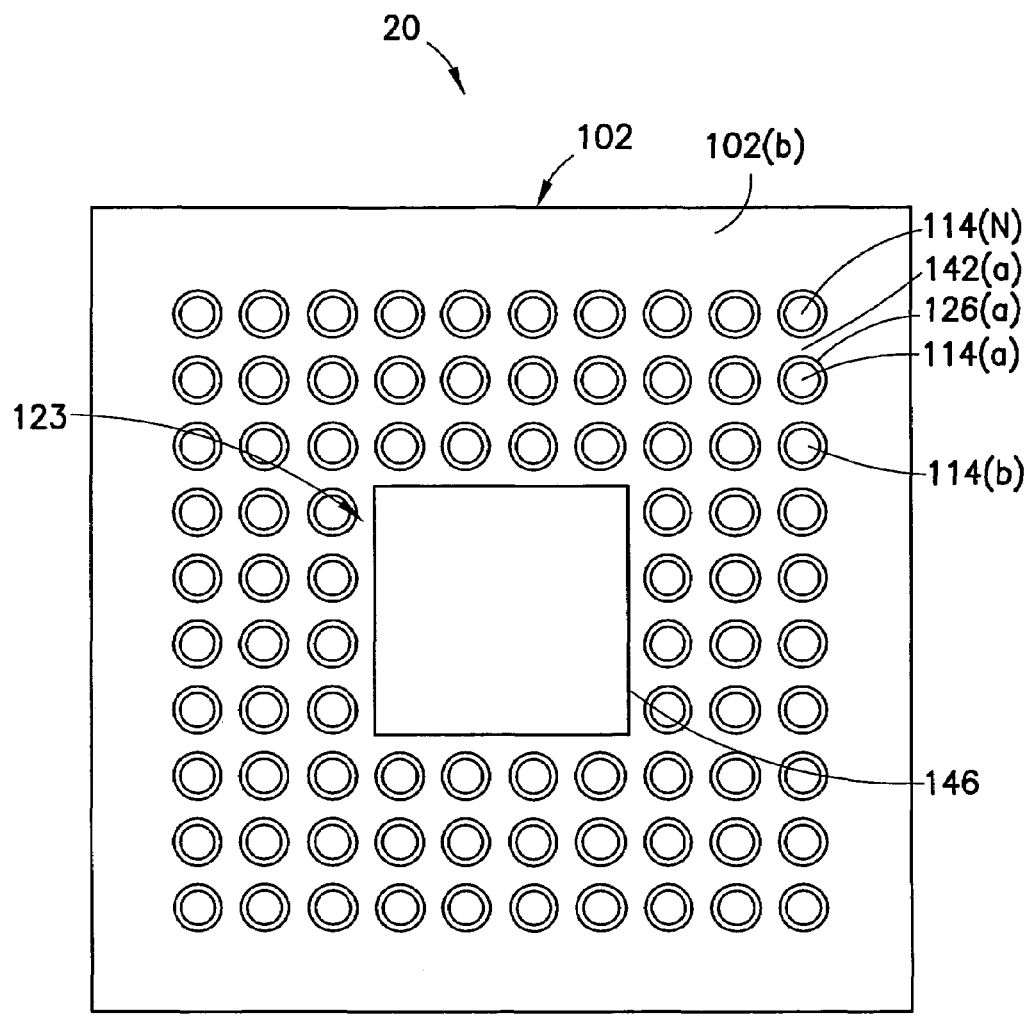
FIG. 2 shows a conventional substrate from the solder ball side.

FIG. 2 shows a view 20 of a conventional substrate from the solder ball side, or PWB facing surface 102(b). The substrate 102 has a die pad area 123 mounted on surface 102(b). Solder ball pads 114(a) . . . (n) generally 114, support an associated thermally conductive solder ball 142(*a*), which disseminates thermal energy. A corresponding via, through bore or hole 126(*a*) facilitates the dissemination of thermal energy (heat) by providing a path for the thermal energy through the substrate material 102. It is an embodiment of the invention that either each solder ball pad 114 may have a corresponding solder ball and via or the solder ball pad may not have a solder ball thereon. As shown in FIG. 2, the die pad 123 is thermally insulated from the solder ball pads 114, and thus the solder balls 142, by thermally insulating material 146. This design reduces the efficiency of removing thermal energy (heat) that is generated by an IC chip mounted on die pad area 123.

Figure 3:
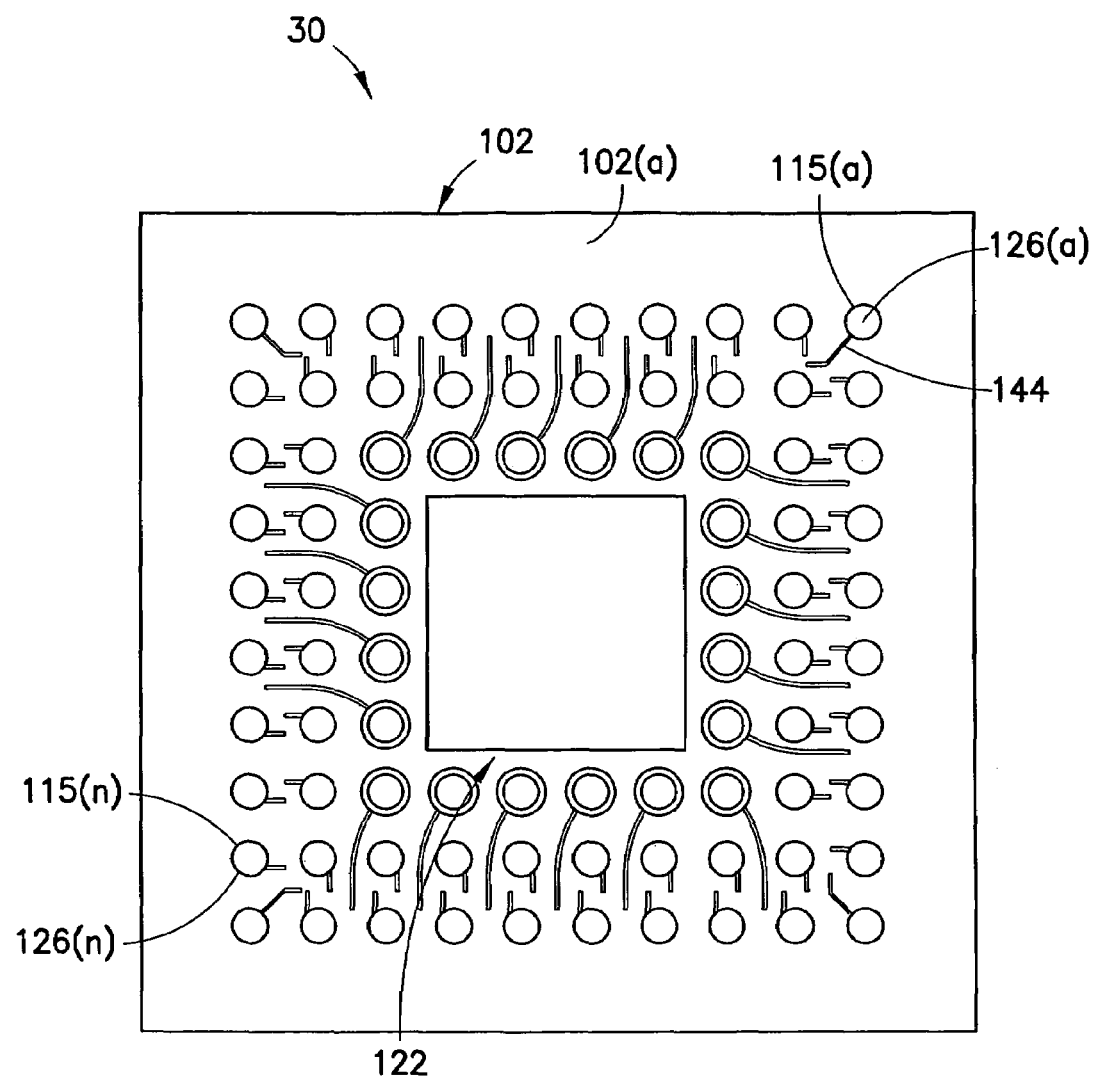
FIG. 3 shows a conventional substrate from an upper side.

FIG. 3 shows a view 30 of a conventional substrate 102 from a chip-facing side. The substrate 102 has an upper surface 102(*a*) on which a die pad area 122 is mounted. Solder ball pads 115 and circuit traces 144 are also shown. Vias, through bores or holes, 126 enable thermal energy to conduct through the substrate 102.

Figure 4:
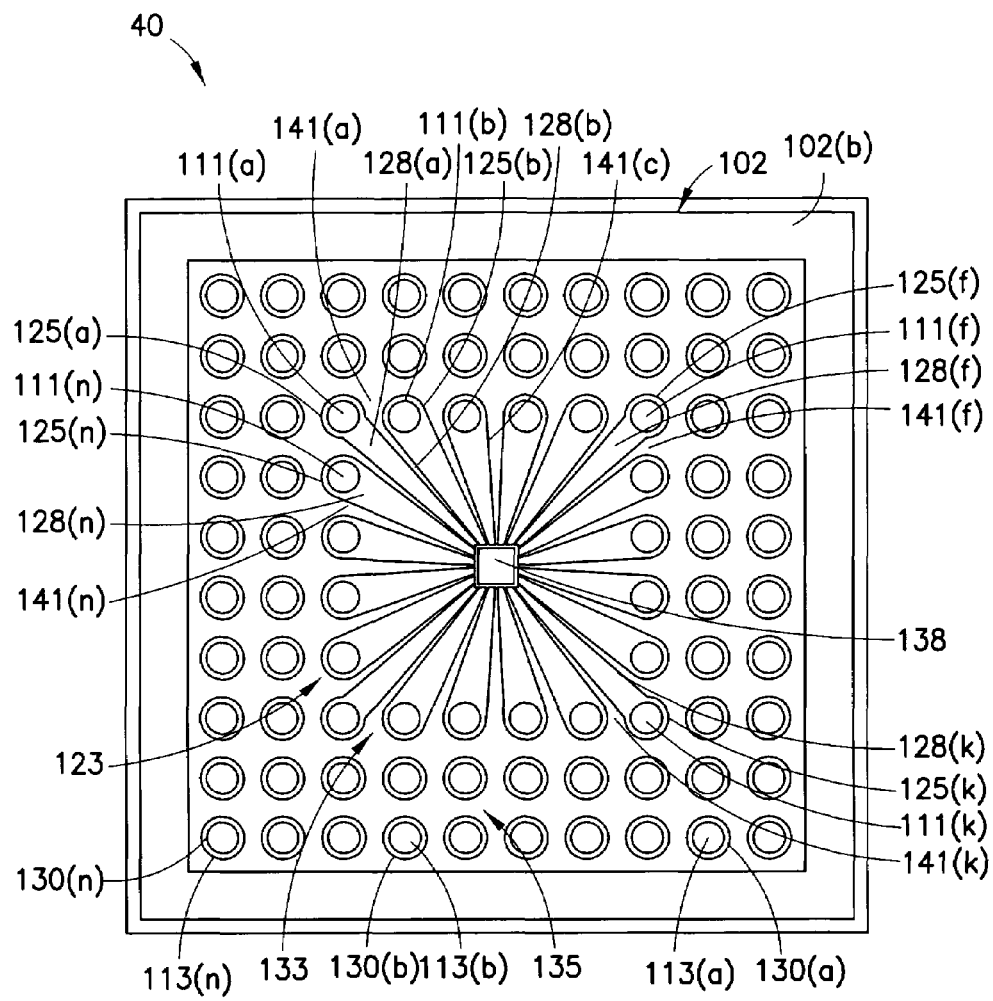
FIG. 4 shows a substrate, from the solder ball side, according to the present invention.

FIG. 4 shows a view 40 of a substrate, from the solder ball side, according to the present invention. Substrate 102 has a PWB facing surface 102(*b*) that has a first region 133 and a second region 135. The first region 133 includes the die pad area 123 and a first set of thermally conductive elements 111(*a*) . . . (*n*), where n is any number. The die pad area 123 is adapted to support an IC chip thereon. The first set of thermally conductive elements (generally 111) may be for example, solder ball pads, or metal surface area. The thermally conductive elements 111 are adapted to connect to a solder ball, either for heat dissipation or signal transmission. First solder ball pads 111 and second thermally conductive elements, 113(*a*) . . . (*n*), where n is any suitable number, which may also be solder ball pads or metal surface area, are disposed on the PWB facing surface 102(*b*).

A solder mask may be used to expose the solder ball pad surfaces, or the solder ball pads 111, 113 may be deposited on the surface 102(*b*) by chemical deposition, etching, stamping or other technique. The first solder ball pads 111 are located in proximity to the die pad area 123, which is shown as region 133 and the second solder ball pads 113(*a*) . . . (*n*)(generally 113) are located further away from the die pad area, in a region identified as 135. Typically solder balls, not shown, are mounted on the surface of the ball pads 111, 113.

Die pad mounting area 123 is disposed in the first region 133 of surface 102(*b*). A thermally and electrically conductive material, such as copper is disposed on the substrate. The thermally and electrically conductive material includes conductors, or fingers or petals 125(*a*) . . . (*n*), where n is any suitable number, that extend or radiate from the die pad area to include selected thermally conductive elements, or solder ball pads. The selected thermally conductive elements are typically first thermally conductive elements 111. Each petal or finger of the thermally and electrically conductive material is typically associated with a particular one of the first set of thermally conductive elements (i.e., petal 125(*a*) contacts thermally conductive element 111(*a*), petal 125(*b*) contacts thermally conductive element 111(*b*), etc.)

The thermally and electrically conductive material 125, is typically formed by etching, stamping, photoresist, chemical vapor deposition, or other technique. Typically the first plurality of solder ball pads 111 are in contact with the conductors 125, which are described as fingers, petals and extensions herein. Thus, the thermally conductive petals 125 provide a path for thermal energy to dissipate from the die pad area 123 to the solder ball pads 111. While it is an embodiment of the present invention that a conductive finger 125(*a*) is in contact with a corresponding thermally conductive element 111(*a*), conductive finger 125(*b*) is in contact with thermally conductive element 11(*b*) it is also within the present invention that other designs and configurations may be used for the petals 125 to dissipate heat through the substrate 102. An advantage of the present invention is that electrical signal paths also serve as thermal conductive paths to dissipate or transfer thermal energy from the die pad area to the substrate and/or PWB.

The dimensions of the thermally conductive petals 125 are typically a function of the design of the package and can have a multitude of configurations. The thermally conductive petals 125 may expand outwardly and become wider near the solder ball pad 111 than at the center of the die pad area.

Solder balls may be used for connecting with contacts on a printed circuit board, thereby forming electrical connections or thermal conductive junctions. The solder balls are typically fabricated from a material including a lead-tin alloy or copper, or copper-based alloy. First thermal balls may be attached to the respective first thermal ball pads, also referred to as thermally conductive elements or ball pads herein, 111 and corresponding contacts on the printed circuit board. Besides transferring the heat generated by a chip on the die pad area 123 away from the die pad area to the printed circuit board, the solder balls also form an electrical connection between the printed circuit board and the IC chip serving as ground or power point connections. Signal balls may also be attached to the ball pads 111 and corresponding contacts on the printed circuit board, thereby forming electrical connections for signal transmission such as input/output signals.

Vias, or through bores 128(*a*) . . . (*n*), where n is any suitable number, are disposed on the conductors or petals 125 and provide a path for thermal energy and electrical current through the substrate 102. Typically each via 128 is associated with a corresponding petal (i.e. petal 125(*a*) has via 128(*a*), etc. Additional, or second vias or through bores, shown as 130(*a*) . . . (*n*), are disposed on the second region 135 of substrate 102. Typically each second via 130 is associated with a corresponding one of the second set of thermally conductive elements, or ball pads, 113 (i.e. conductive element 113(*a*) has via 130(*a*), etc. The ball pads 113 are distinguished from ball pads 111 because ball pads 111 are associated with a conductive projection while ball pads 113 are not associated with a conductive projection.

Insulating members 141(*a*) . . . (*n*), where n is any suitable number, electrically and thermally insulate the petals 125 from each other. The insulating material 141 can be applied through a masking layer, such as a photoresist or other deposition technique that deposits the insulating material on desired areas of the substrate material. A centrally disposed thermal ball 138 may be positioned on the die pad area 123 to provide a thermal and conductive path for thermal energy (heat) and electrical current, respectively.

Figure 5:
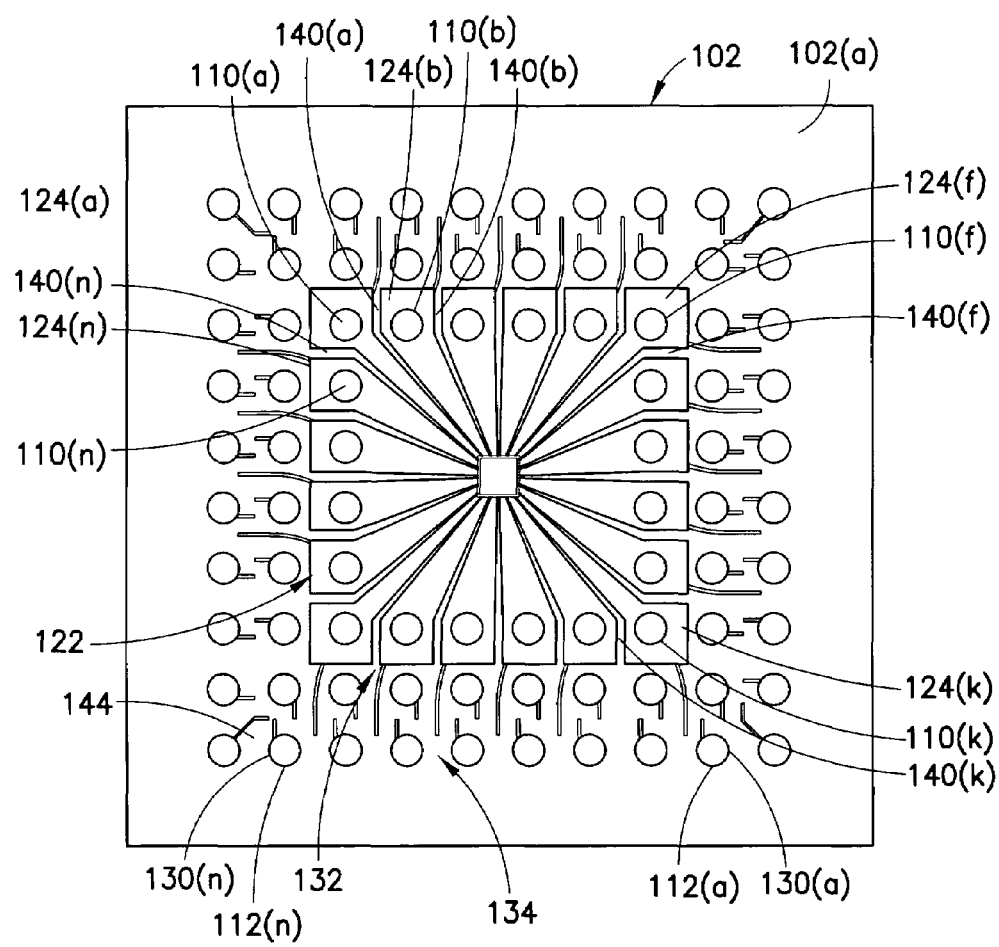
FIG. 5 shows a substrate, from the upper side, according to the present invention.

FIG. 5 shows a view 50 of substrate 102, from the top side, according to the present invention. Surface 102(*a*) has a die pad area 122 that has fingers, or petals or conductors 124(*a*) . . . (*n*)(generally 124) that radiate from the die pad area 122 such that each finger or petal 124 contacts a corresponding one of a first set of thermally conductive elements 110(*a*) . . . (*n*) (also referred to as solder ball pads, thermal ball pads or thermal pads herein). (The die pad area 122 shown in FIG. 5 is the die pad on surface 102(*a*) and is similar in dimension to die pad area 123 of surface 102(*b*), shown in FIG. 4. Also, petals 124 shown in FIG. 5 may have similar dimensions to the petals 125 shown in FIG. 4.) The petals 124 enhance thermal dissipation from the die pad area 122 to the solder ball pads 110.

A second set of thermally conductive elements (also referred to as solder ball pads, ball pads, thermal ball pads or thermal balls herein) 112(*a*) . . . (*n*) are located in a second region 134, which is outside the first region 132. The thermally conductive elements 112 may be used to support a solder ball that is used for thermal or electrical conduction. Circuit traces, or pattern traces, 144, which are used to conduct electrical current, are also shown. The substrate 102 typically has a laminated insulating layer. The insulating layer may be formed from a glass epoxy resin (FR-4, FR-5), bismaleimide-triaze (BT) or epoxy resin. The pattern trace layer may be formed by depositing a conductive material such as copper, nickel, palladium, silver, nickel palladium alloy or alloys thereof. Alternatively, the pattern trace layer can be formed by a technique, such as photolithography, etching, plating or other chemical process, depending on design considerations.

An insulating material forms insulating areas 140(*a*) . . . (*n*) between petals or fingers 124, causing petals 124 to be thermally and electrically insulated from each other. Specifically, as shown in FIG. 5, insulating finger 140(*a*) isolates conductor 124(*a*) from conductor 124(*b*), insulating finger 140(*b*) isolates conductor 124(*b*) from conductor 124(*c*), etc.

Vias, or through bores, 130(*a*) . . . (*n*) are also shown in FIG. 5. These vias 130 extend from surface 102(*a*) to surface 102(*b*), shown in FIG. 4.

Figure 6:
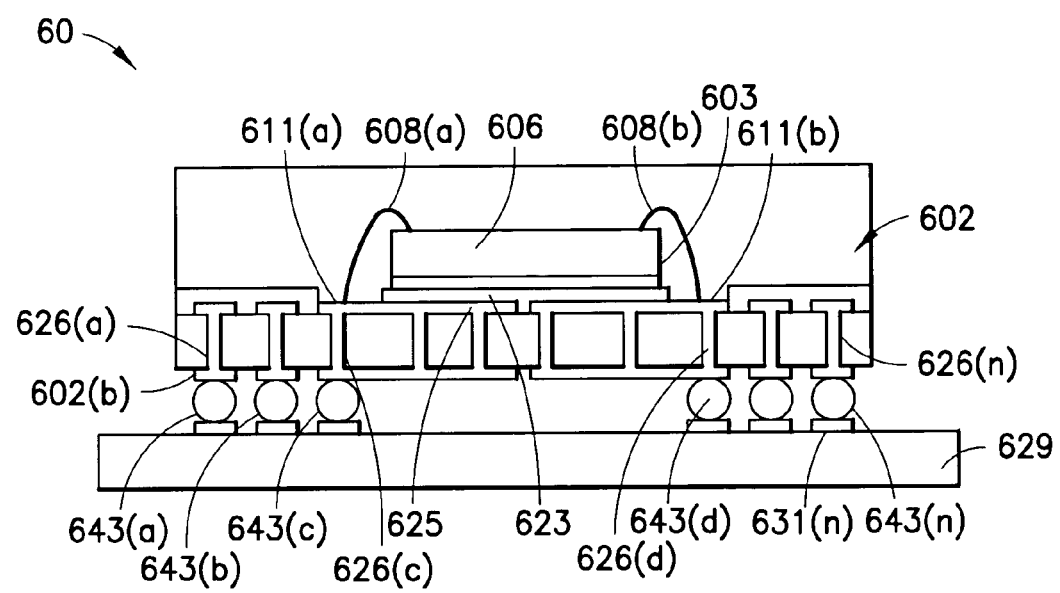
FIG. 6 shows a side view of the heat transfer path from the die pad to the PWB.

FIG. 6 shows a side view 60 of the heat transfer path from the die pad to the PWB. Substrate 602 has lower, or second, surface 602(*b*). Chip 606 is mounted on die pad area 623 by adhesive 603. Adhesive 603 may be, for example, glue, epoxy, resin or any suitable adhesive material that bonds the chip 606 to the die pad area 623. Interconnectors 608(*a*) and 608(*b*) are shown as wires, however, other connection means may be used to couple areas of chip 606 to thermal pads, or solder ball pads 611(*a*) and 611(*b*), respectively. Vias 626(*a*) . . . (*n*) provide a thermal and electrical path from associated pads 611 to one of the thermal balls 643(*a*) . . . (*n*), where n is any suitable number, which are typically disposed on lower surface 602(*b*). Solder balls 643(*a*) . . . (*n*) are mounted on the PWB 629 using an associated bonding site, or pad, 631(*a*) . . . (*n*). The thermally conductive projections, shown generally as 625, provide thermal and electrical pathways from the die pad area 623 to the pads 611.

Figure 7:
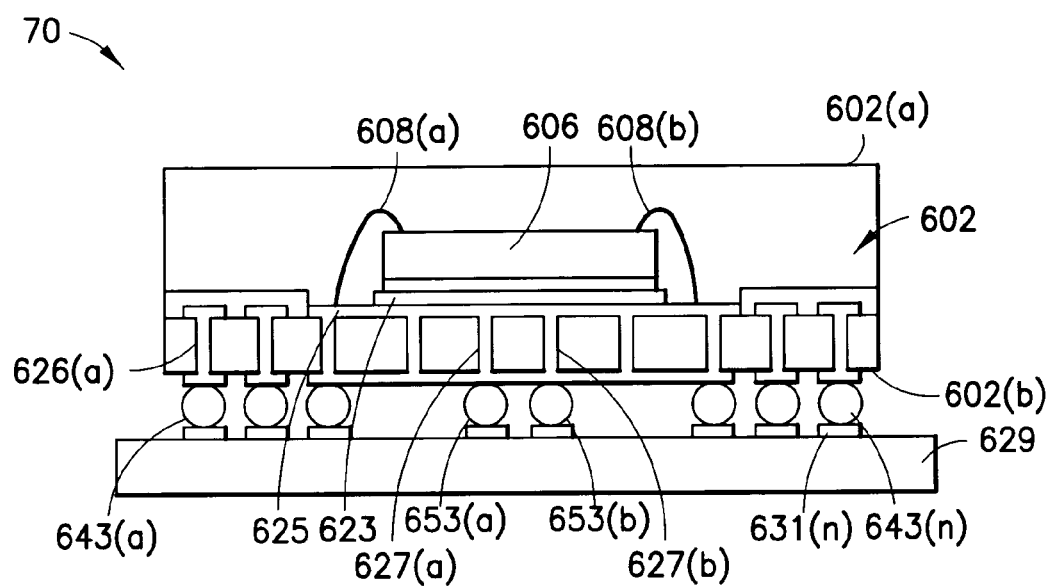
FIG. 7 shows a side view of the present invention with thermal balls beneath the heat transfer path; and, FIGS. 8–13 show the present invention with exemplary conductive layer configurations in the die pad area.

FIG. 7 shows a side view 70 of the heat transfer path from the die pad area 623 to the PWB 629. FIG. 7 is similar to FIG. 6, however, FIG. 7 shows additional thermal balls 653(*a*) and 653(*b*) located beneath the die pad area 623. Associated vias 627(*a*) and 627(*b*) provide a transmission path for heat from the die pad area 623 to the thermal balls 653. Although only two thermal balls 653(*a*) and 653(*b*) are shown, with associated vias 627(*a*) and 627(*b*), any suitable number may be used. The other elements shown in FIG. 7 have been discussed in relation to FIG. 6. FIG. 7 shows that the area on the substrate that is beneath the die pad area.

FIGS. 8–13 show the present invention with exemplary conductive layer configurations in the die pad area. These conductive layer configurations are alternate embodiments of the invention. The relationship between the conductive material and insulating material is a function of the design and application requirements.

Figure 8:
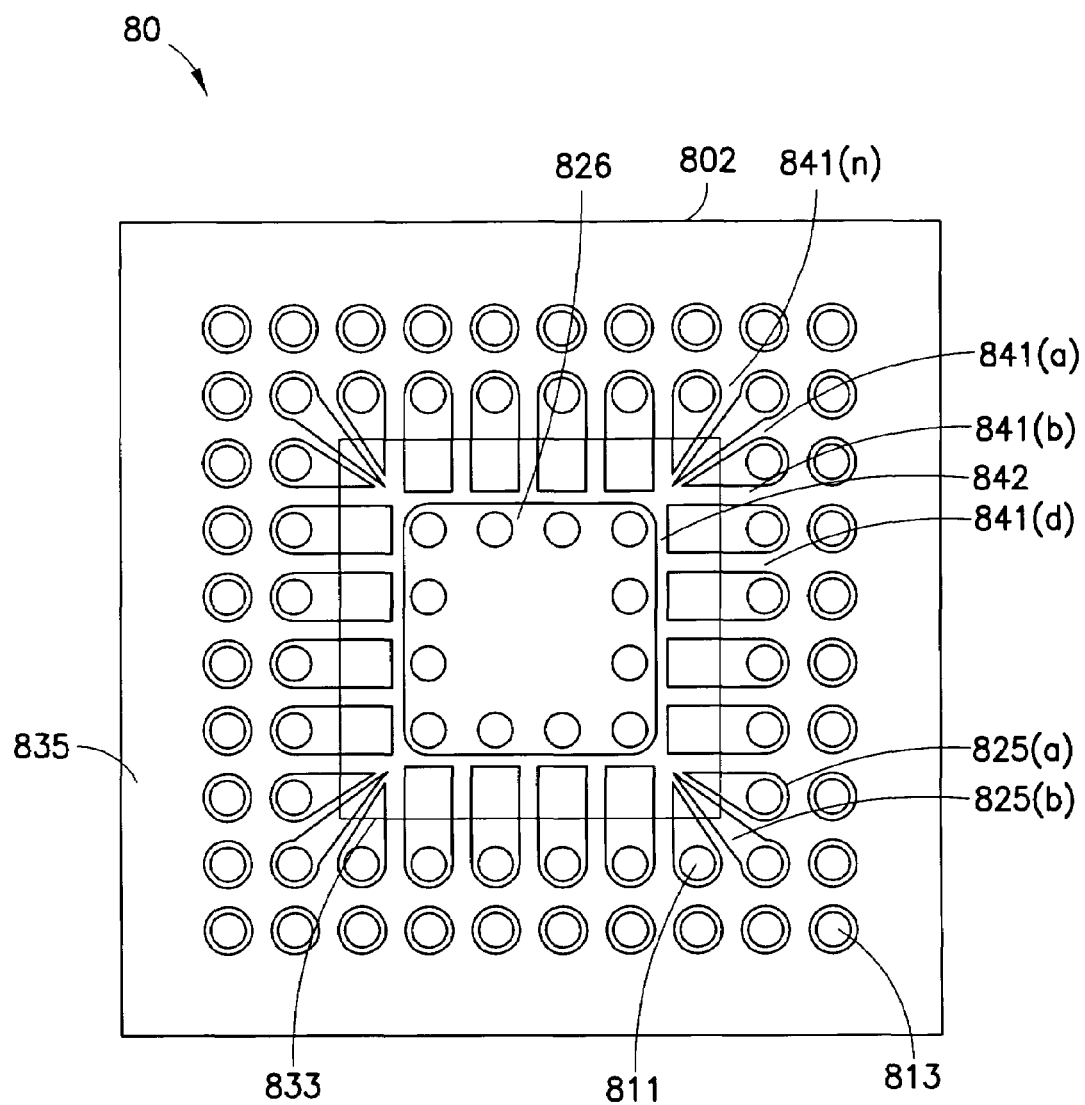

FIG. 8 shows view 80 which includes substrate 802 having die pad area 833 and a second area 835, which is beyond the die pad area 833. First thermal pads, or solder ball pads, or conductive elements, generally 811 are in thermal and electrical contact with petals, or projections, or fingers 825(*a*) . . . (*n*). Petals, or fingers, generally 825 are separated from each other by insulating material 841(*a*) . . . (*n*). An insulating barrier 842 insulates an inner portion of conductive material 826 from an outer portion fingers or petals 825. Second thermal pads are shown generally as 813. These thermal pads are in second area 835 and are not in contact with petals 825.

Figure 9:
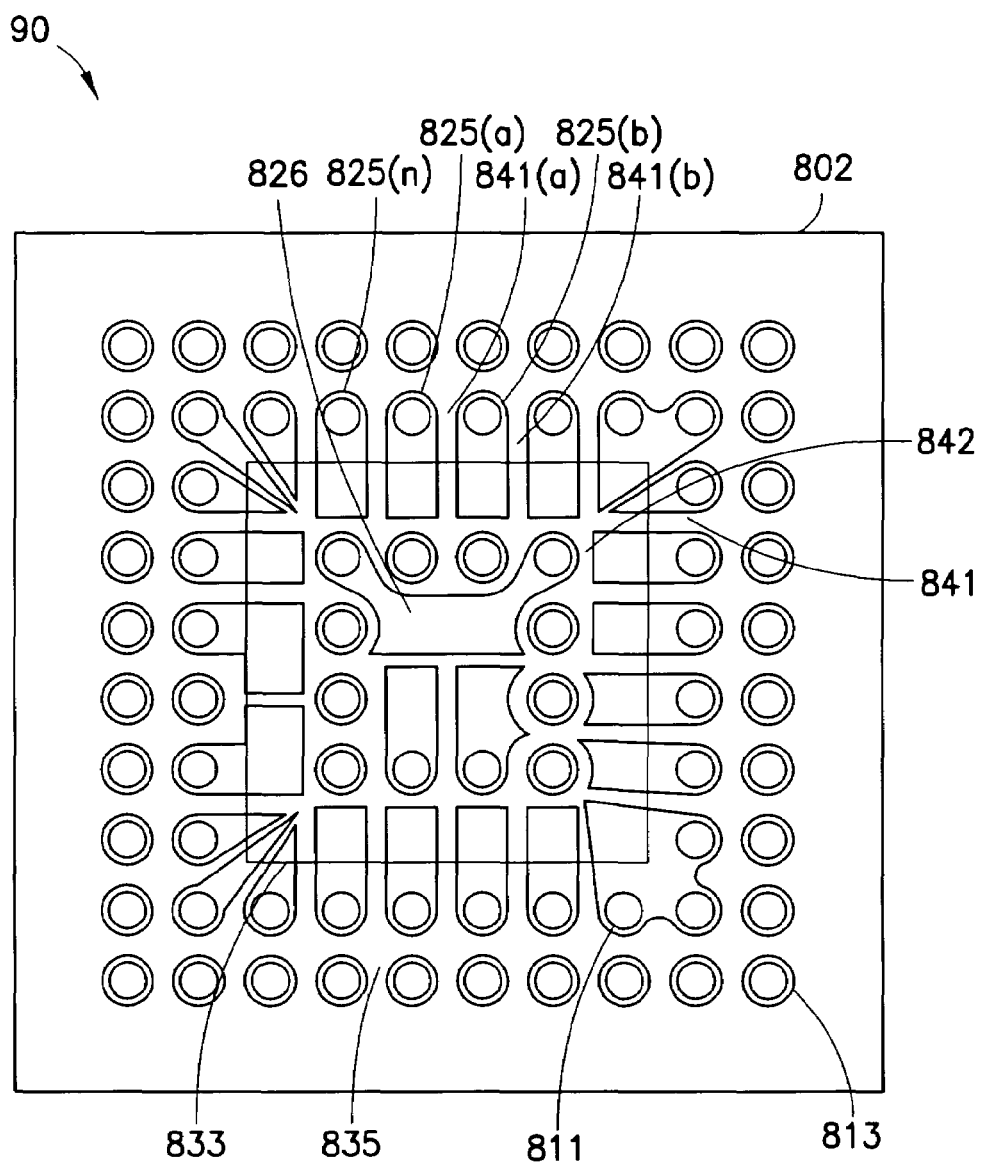
Figure 10:
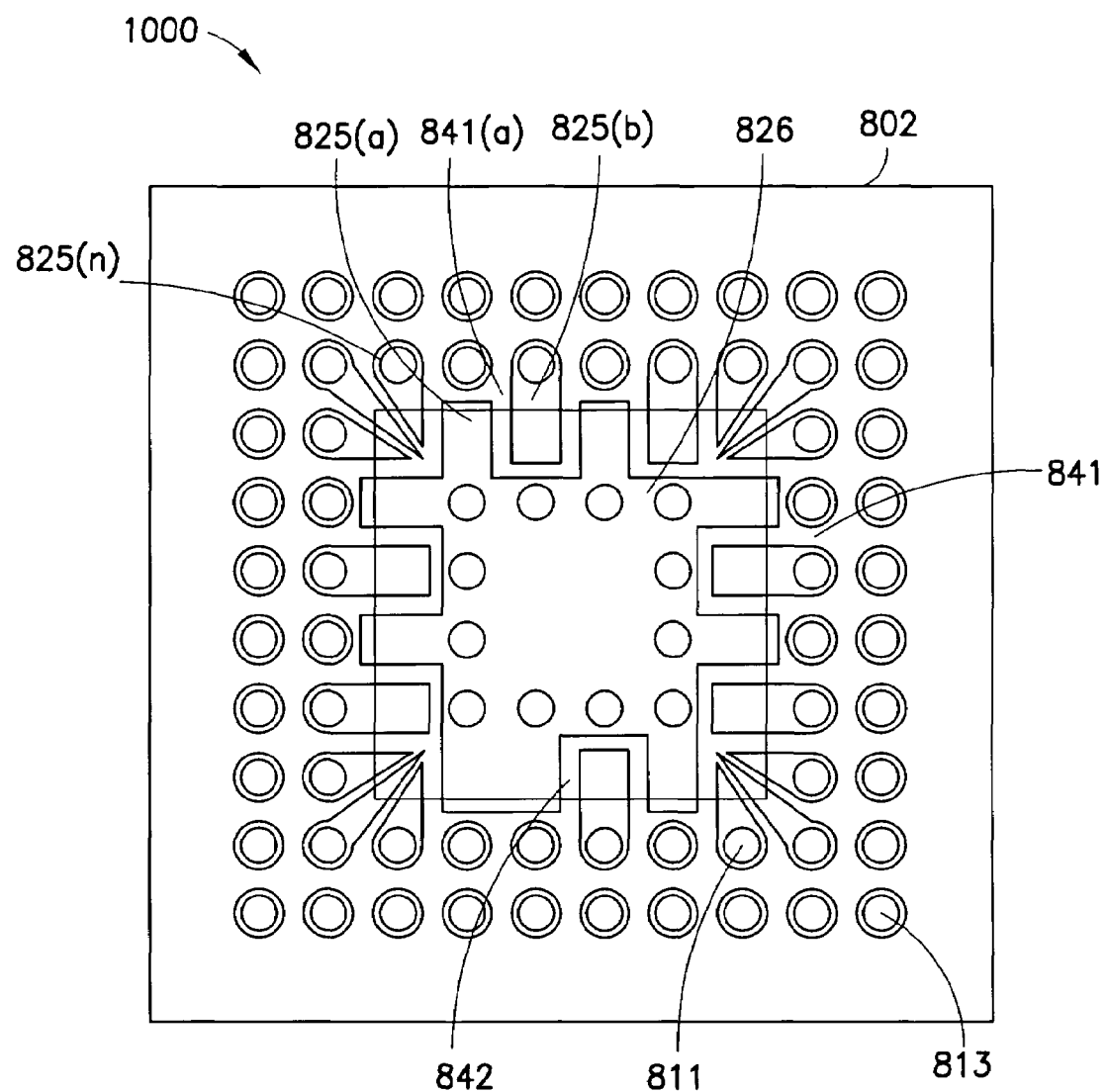
Figure 11:
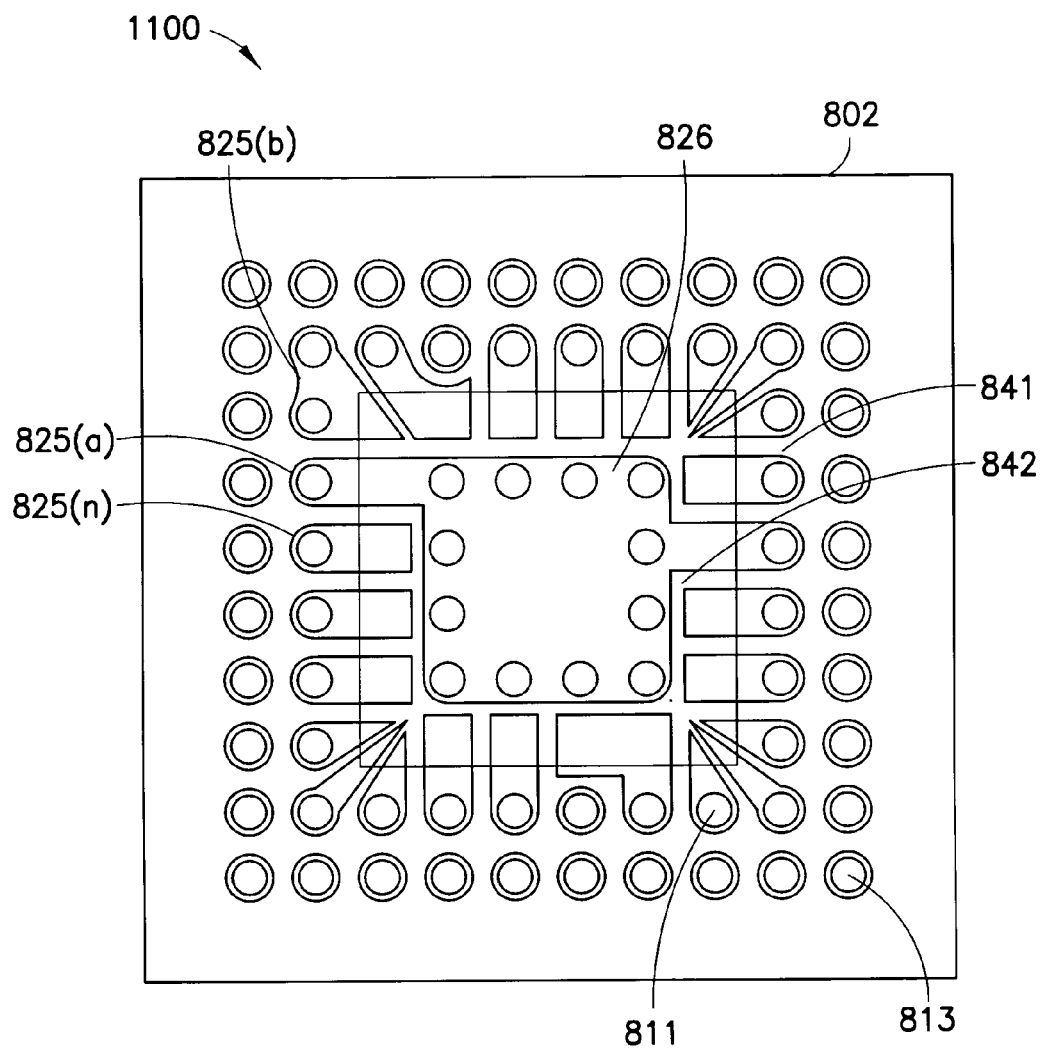
Figure 12:
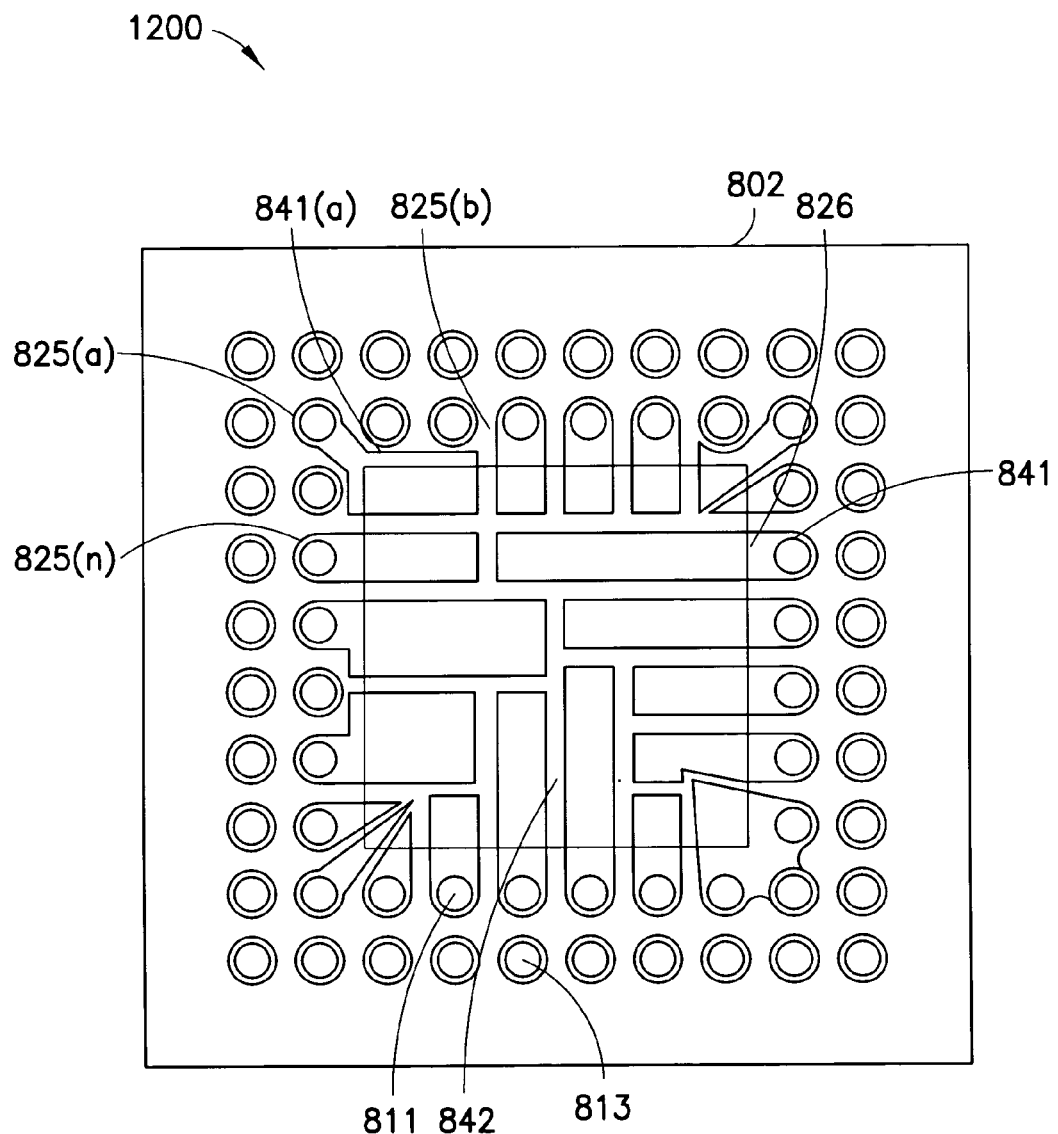
Figure 13:
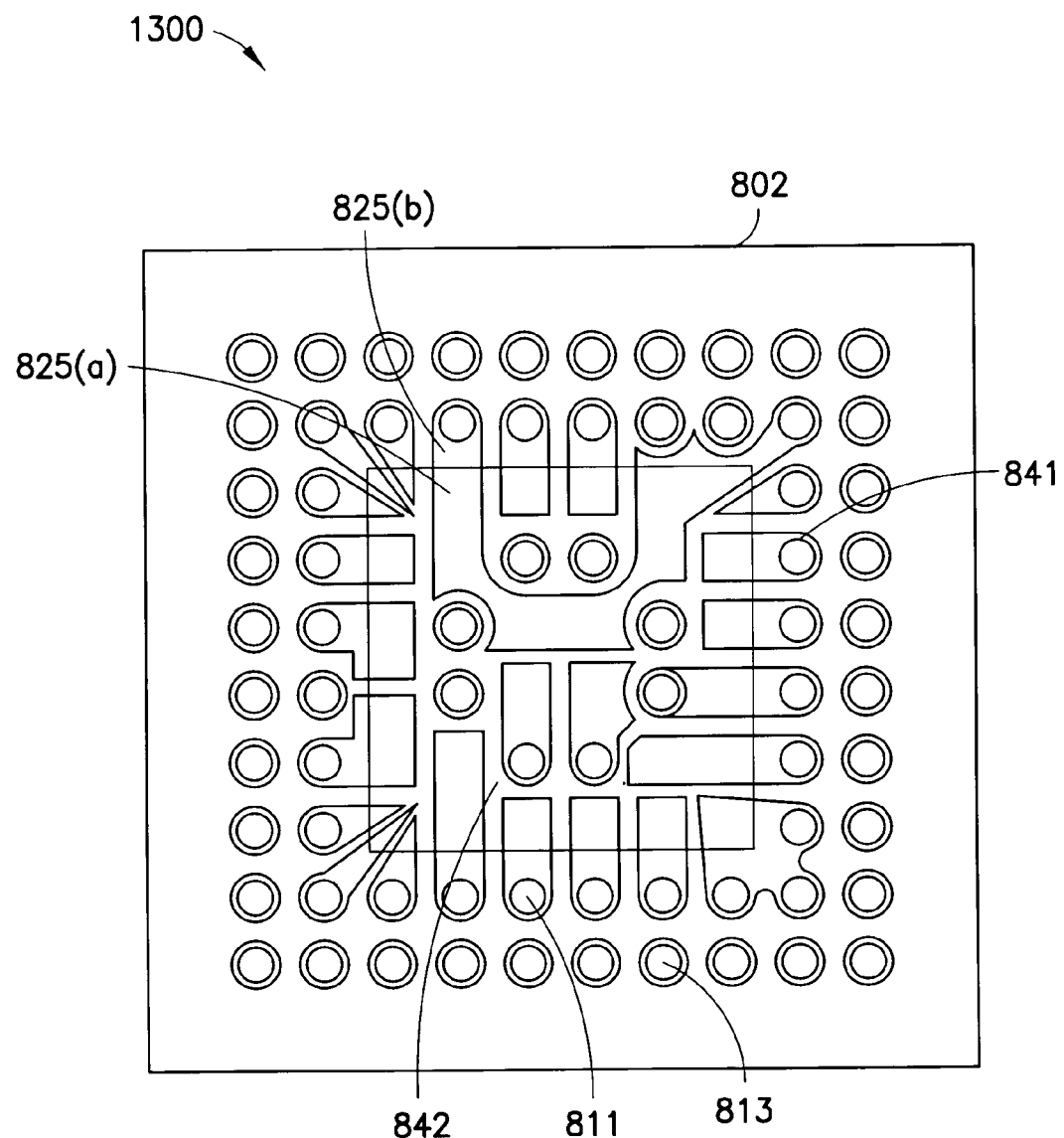

FIG. 9 shows a view 90 of the present invention. FIG. 9 shows that the conductive projections, or petals 825 comprise portions 825(*a*) . . . (*n*). There are also conductive portions 826 that are within the die pad area. The conductive portions 826 are separated by insulating material 842. The insulating material 841 and 842 produces a desired configuration of the portions of the conductive material 825 and 826. Thermal pads 811 and 813 are also shown as well as first and second areas 833 and 835, respectively.

FIGS. 10–13 show alternate configurations, 1000, 1100, 1200 and 1300, respectively, of the conductive petals, or fingers 825 and inner portion 826 as well as insulating material 841 and 842. The other elements have been described in relation to FIGS. 8 and 9.

While the present invention has been described in terms of a "chip-up" configuration, it is also an embodiment of the present invention to utilize the heat dissipation technique in a "flip-chip" or chip-down configuration. Also, the chip may be encapsulated with an epoxy or resin.

While described in the context of an IC package, it should be appreciated that these teachings have applicability as well to other types of packaging in which heat dissipation is desired. Furthermore, it should be realized that the above teachings are exemplary, and are not to be construed in a limiting sense upon the practice of this invention.

What is claimed is:

1. An integrated circuit package comprising:
    a substrate material having a first surface and a second surface;
    a die pad area, having dimensions suitable to mount an integrated circuit thereon;
    a plurality of thermally and electrically conductive signal elements disposed on the first surface of the substrate material spaced from the die pad area;
    a plurality of vias, one or more of the vias coupled to an associated signal element, the one or more vias providing thermal and electrical conductivity from the first surface of the substrate material to the second surface of the substrate material; and
    a plurality of electrically and thermally conductive projections that radiate outwardly from the die pad area, each projection coupled to an associated signal element, wherein each of the plurality of projections conduct thermal energy from the die pad area to at least one of the plurality of signal elements.

2. The apparatus of claim 1, further comprising:
    a plurality of signal balls disposed on the second surface of the substrate material and outside the die pad area, one or more of the signal balls in thermal contact with an associated one of the plurality of vias, and one or more of the signal balls adapted to conduct thermal energy.

3. The apparatus of claim 2, wherein selected vias of the plurality of vias are located outside the die pad area.

4. The apparatus of claim 2, further comprising:
    a printed wiring board,
    wherein the substrate is mounted on the printed wiring board and the thermal energy is dissipated from the die pad area to the printed wiring board through the signal balls.

5. The apparatus of claim 1, further comprising an integrated circuit disposed on the die pad area.

6. The apparatus of claim 1, further comprising:
a central thermally conductive element disposed at a location on the die pad area.

7. The apparatus of claim 6, wherein the central thermally conductive element is adapted to conduct electrical current.

8. The apparatus of claim 1, where the plurality of projections are electrically isolated from one another.

9. The apparatus of claim 1, wherein the plurality of projections comprise a thermally and electrically conducting material.

10. An integrated circuit package comprising:
a substrate having a first surface, a second surface and a die pad area on the first surface, wherein the die pad area is adapted to have an integrated circuit mounted thereon;
a plurality of thermally and electrically conductive signal elements disposed on the first surface of the substrate spaced from the die pad area;
a plurality of electrically and thermally conductive projections that extend outwardly from the die pad area, wherein each projection is coupled to an associated one of the signal elements outside of the pad area, and wherein the projections are adapted to conduct thermal energy from the die pad area to the signal elements spaced from the die pad area; and a plurality of vias, wherein each of the vias is coupled to an associated one of the signal elements, and wherein the vias provide thermal and electrical conductivity from the first surface of the substrate to the second surface of the substrate.

11. An integrated circuit package as in claim 10 further comprising an integrated circuit mounted on the die pad area and a plurality of electrical interconnects connecting the integrated circuit to the conductive signal elements.

12. An integrated circuit package as in claim 10 wherein the conductive signal elements comprise solder ball pads.

13. An integrated circuit package as in claim 10 further comprising additional conductive signal elements on the first surface spaced from the die pad area, wherein the additional conductive signal elements are not coupled to the conductive projections, and wherein the additional signal elements are coupled to respective ones of the vias such that the vias electrically connect the additional signal elements to the second surface.

14. An integrated circuit package as in claim 13 wherein the additional signal elements comprise solder ball pads.

15. An integrated circuit package as in claim 10 further comprising thermal solder balls on the substrate at the second surface, wherein the thermal solder balls are located under the die pad area and are not electrically connected to the conductive signal elements by the vias.

16. An integrated circuit package comprising:
a substrate having a first surface, a second surface and a die pad on the first surface, wherein the die pad is adapted to have an integrated circuit mounted thereon;
a plurality of thermally and electrically conductive signal elements disposed on the first surface of the substrate, wherein the signal elements are spaced from the die pad;
a plurality of electrically and thermally conductive projections that extend outwardly from the die pad, wherein each projection is coupled to an associated one of the signal elements, and wherein the projections are adapted to conduct thermal energy from the die pad to respective ones of the signal elements;
a plurality of vias, wherein each of the vias in a first set of the vias is coupled to an associated one of the signal elements, wherein the vias of the first set of vias provide thermal and electrical conductivity from the first surface of the substrate to the second surface of the substrate, and wherein a second set of the vias, comprising at least one of the vias, is not electrically coupled to the signal elements and provides thermal conductivity from the first surface of the substrate to the second surface of the substrate; and
solder balls at the second surface, wherein the solder balls comprise first electrical and thermal solder balls connected to the vias of the first set of vias, and second thermal solder balls located under the die pad connected to the vias of the second set of vias, wherein the second thermal solder balls are not electrically coupled to the conductive signal elements.

17. An integrated circuit package as in claim 16 wherein the conductive signal elements comprise solder ball pads.

18. An integrated circuit package as in claim 16 further comprising an integrated circuit mounted on the die pad and a plurality of electrical interconnects connecting the integrated circuit to the conductive signal elements.

19. The apparatus of claim 1 wherein the plurality of electrically and thermally conductive projections comprise non-signal projections which do not transmit electrical signals between the integrated circuit and the signal elements.

20. An integrated circuit package as in claim 10 wherein the plurality of electrically and thermally conductive projections comprise non-signal projections which do not transmit electrical signals between the integrated circuit and the signal elements.

* * * * *